United States Patent [19]
Kim et al.

[11] Patent Number: 5,989,968
[45] Date of Patent: Nov. 23, 1999

[54] METHOD OF MAKING BIPOLAR TRANSISTOR HAVING REDUCED RESISTANCE

[75] Inventors: Young-ok Kim, Kyungki-do; Soo-cheol Lee, Seoul, both of Rep. of Korea

[73] Assignee: Samsung Electronics Co., Ltd., Kyungki-Do, Rep. of Korea

[21] Appl. No.: 08/932,765

[22] Filed: Sep. 17, 1997

Related U.S. Application Data

[62] Division of application No. 08/564,970, Nov. 30, 1995, abandoned.

[30] Foreign Application Priority Data

Nov. 30, 1994 [KR] Rep. of Korea ..................... 94-32135

[51] Int. Cl.⁶ ............................................. H01L 21/331
[52] U.S. Cl. ..................... 438/365; 438/202; 438/309; 438/364; 438/365; 438/369; 438/508; 438/509
[58] Field of Search .................................. 438/202, 309, 438/364, 365, 369, 508, 509, FOR 165, FOR 322, FOR 346; 148/DIG. 10, DIG. 11

[56] References Cited

U.S. PATENT DOCUMENTS

| 3,836,998 | 9/1974 | Kocsis et al. ............................... 357/53 |
| 4,871,977 | 10/1989 | Schilling et al. ......................... 330/255 |
| 4,960,726 | 10/1990 | Lechaton et al. .......................... 437/59 |
| 5,179,432 | 1/1993 | Husher ..................................... 257/593 |
| 5,286,986 | 2/1994 | Kihara et al. ............................. 257/215 |
| 5,374,845 | 12/1994 | Havemann ................................ 257/592 |
| 5,387,553 | 2/1995 | Moksvold et al. .......................... 437/32 |
| 5,389,552 | 2/1995 | Irammanesh et al. ....................... 437/31 |
| 5,488,002 | 1/1996 | Kimura et al. ............................. 437/31 |
| 5,589,409 | 12/1996 | Bulucea et al. ............................ 437/31 |
| 5,698,459 | 12/1997 | Grubisich et al. ............... 148/DIG. 10 |
| 5,717,241 | 2/1998 | Mahli et al. ............................. 257/378 |
| 5,733,791 | 3/1998 | Iranmanesh ............................... 437/31 |

FOREIGN PATENT DOCUMENTS

| 403198344 | 8/1991 | Japan ............................. 438/FOR 165 |
| 404277630 | 10/1992 | Japan ............................. 438/FOR 165 |
| 405109748 | 4/1993 | Japan ............................. 438/FOR 165 |

*Primary Examiner*—George Fourson
*Assistant Examiner*—Long Pham
*Attorney, Agent, or Firm*—Pillsbury Madison & Sutro LLP

[57] ABSTRACT

In a bipolar transistor and the manufacturing method thereof, the bipolar transistor includes a first conductive well, an emitter impurity layer formed in the center of the well, a base impurity layer formed in the form of completely surrounding the emitter impurity layer, and a first conductive high-concentration collector impurity layer having an annular shape along the edge of the well, and maintaining a constant interval from the base impurity layer. The first conductive layer formed to be parallel with the high-concentration collector impurity layer is connected therewith through a contact hole, and is connected with the collector electrode through another contact hole. Owing to a simple manufacturing process, the processing time and cost can be reduced. Also, parasitic bipolar transistors are not generated nor is increased collector resistance produced, thereby increasing reliability.

15 Claims, 14 Drawing Sheets

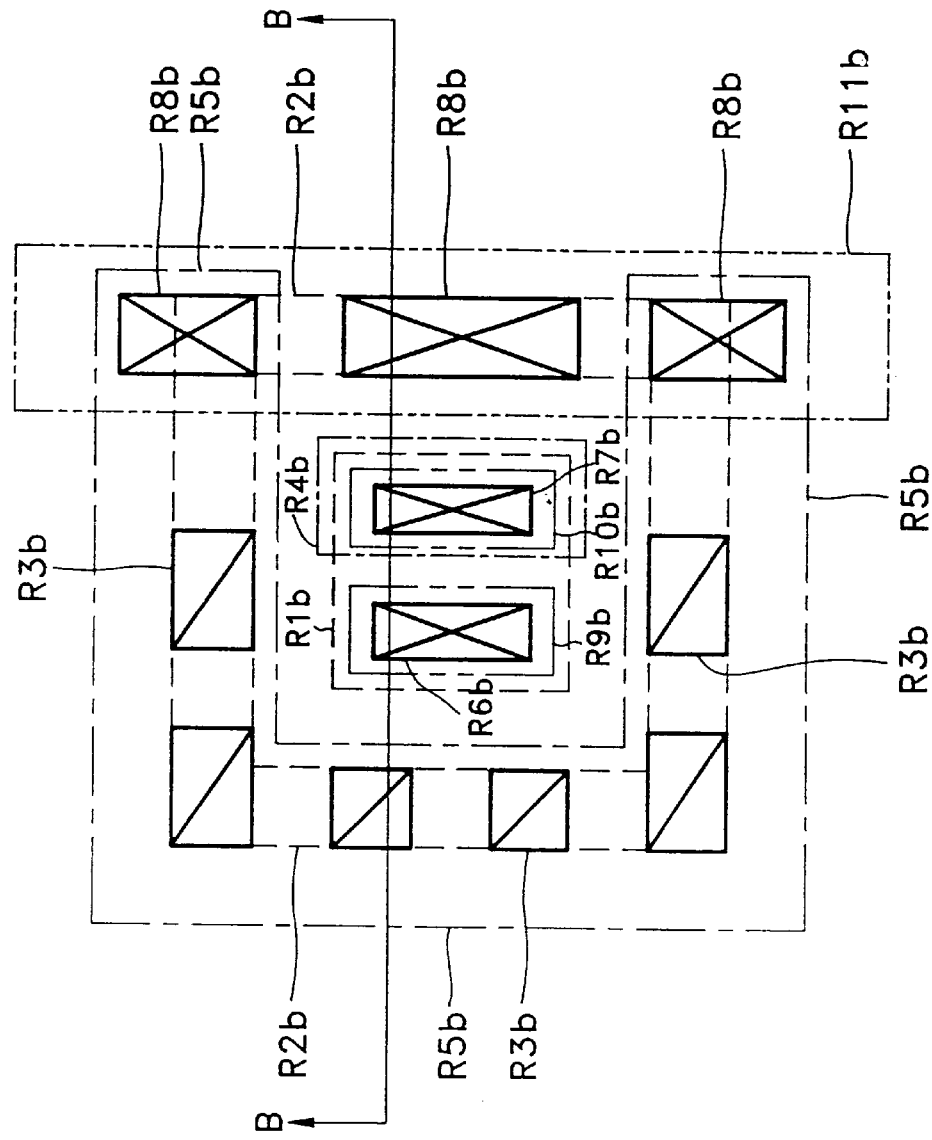

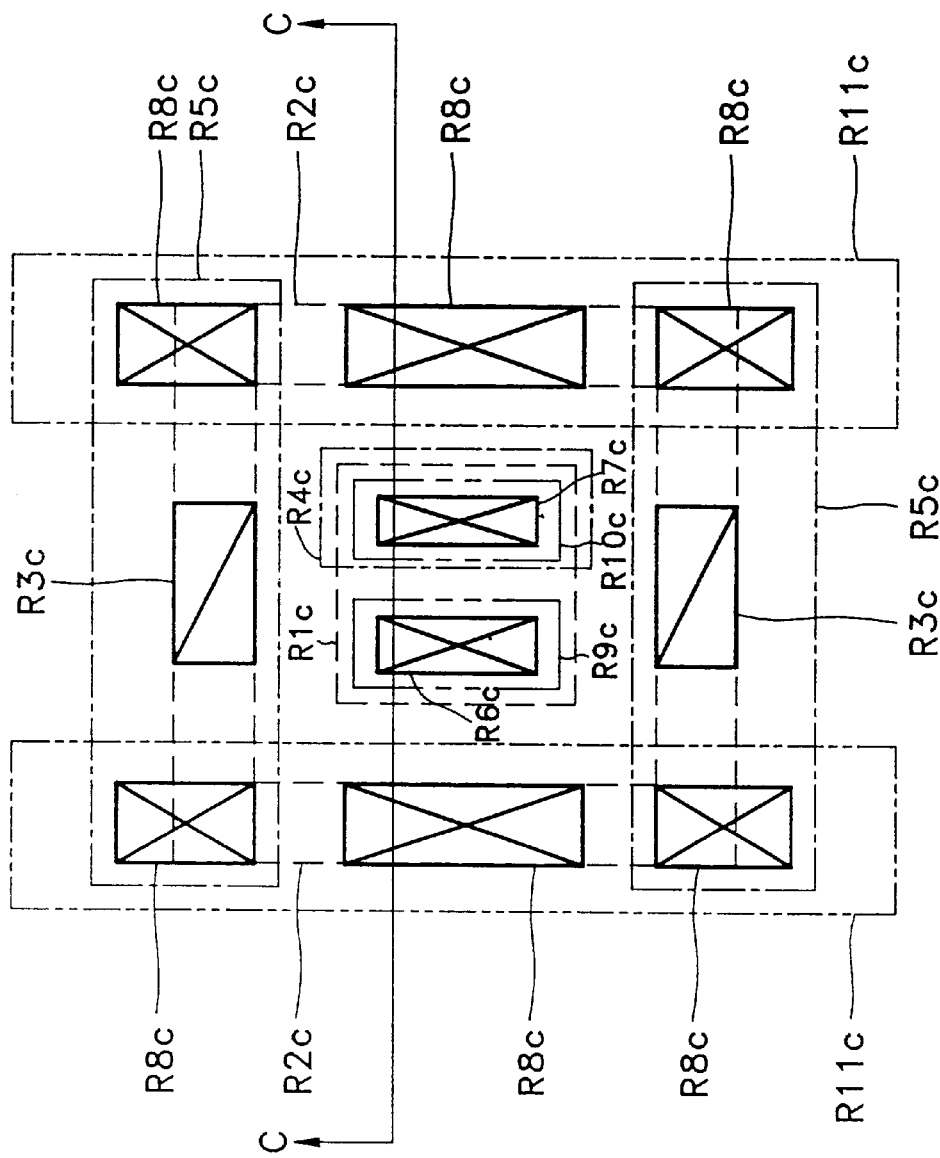

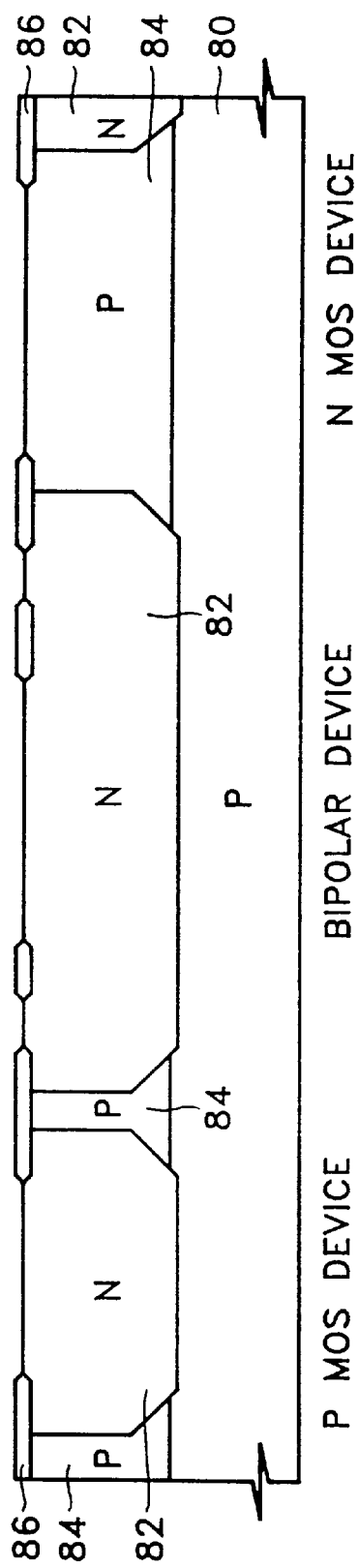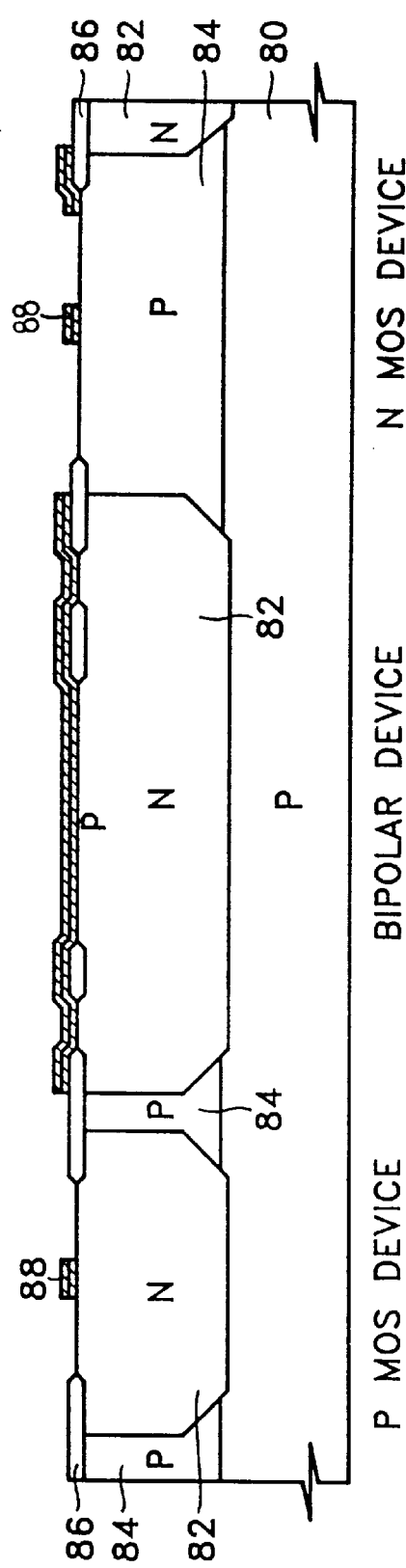

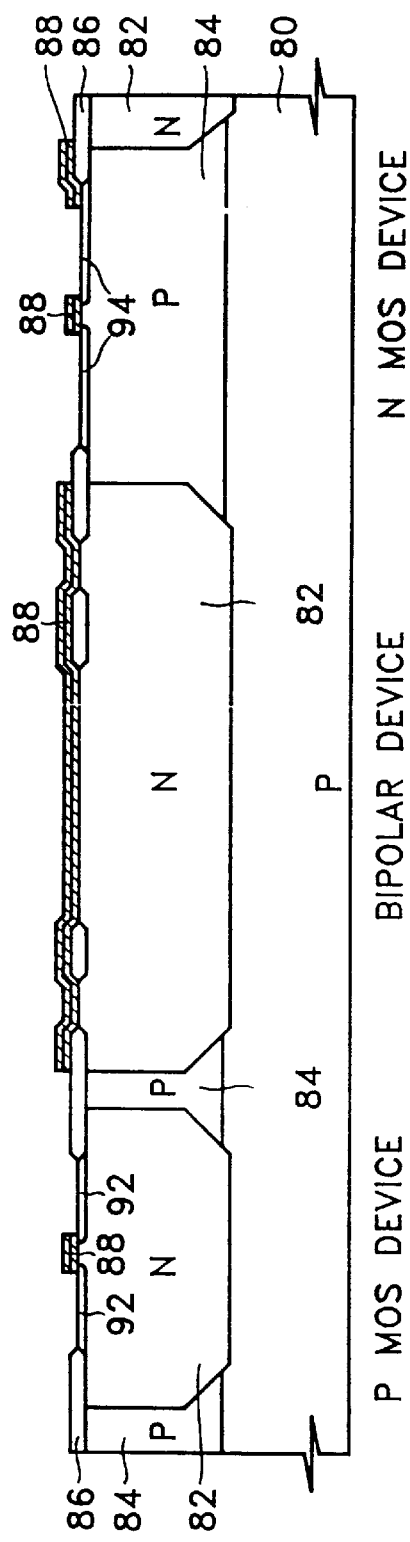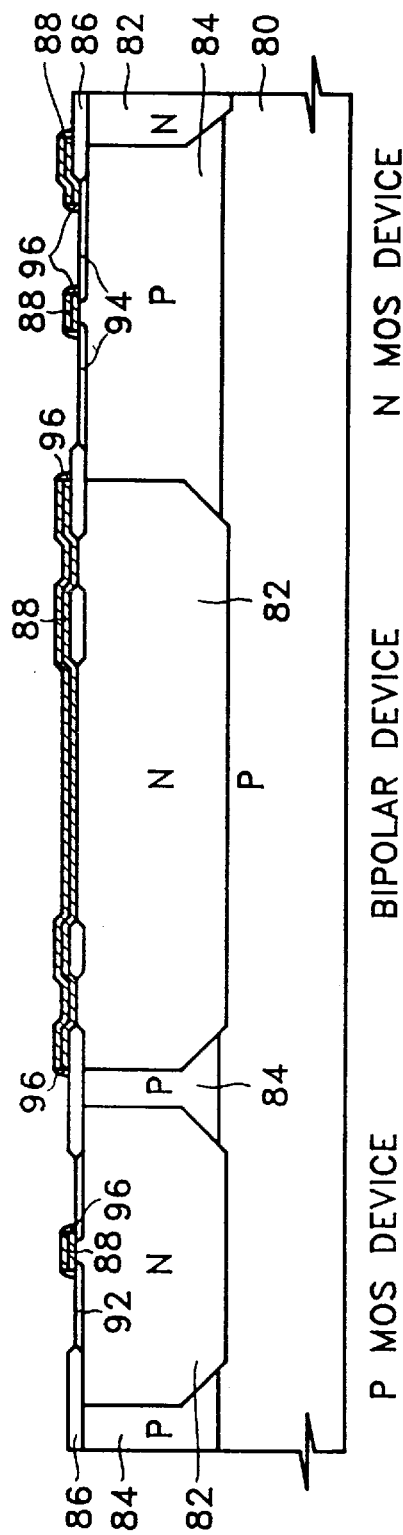

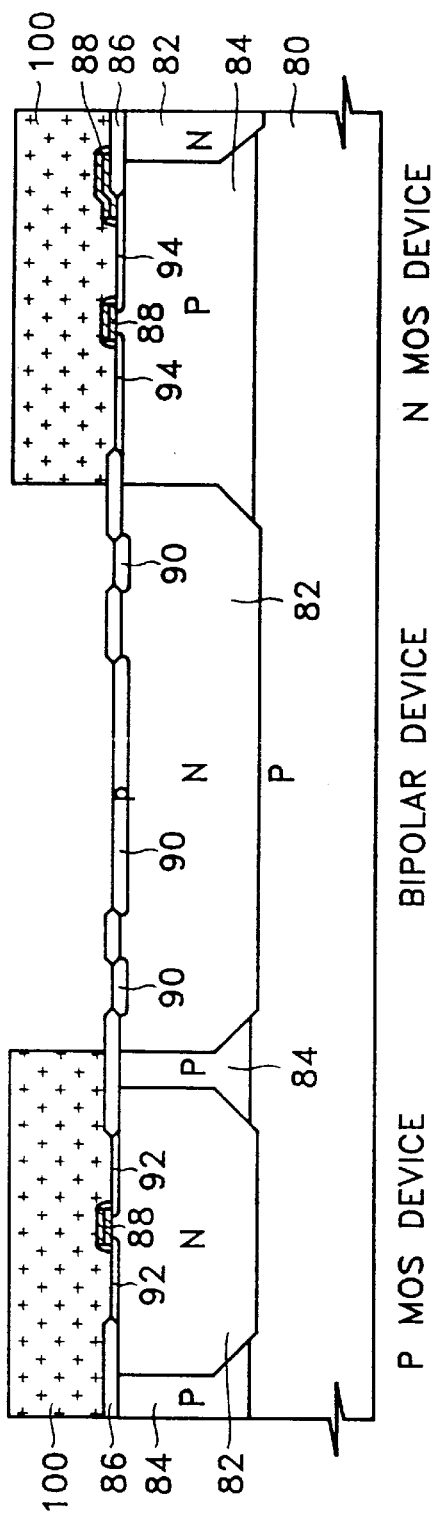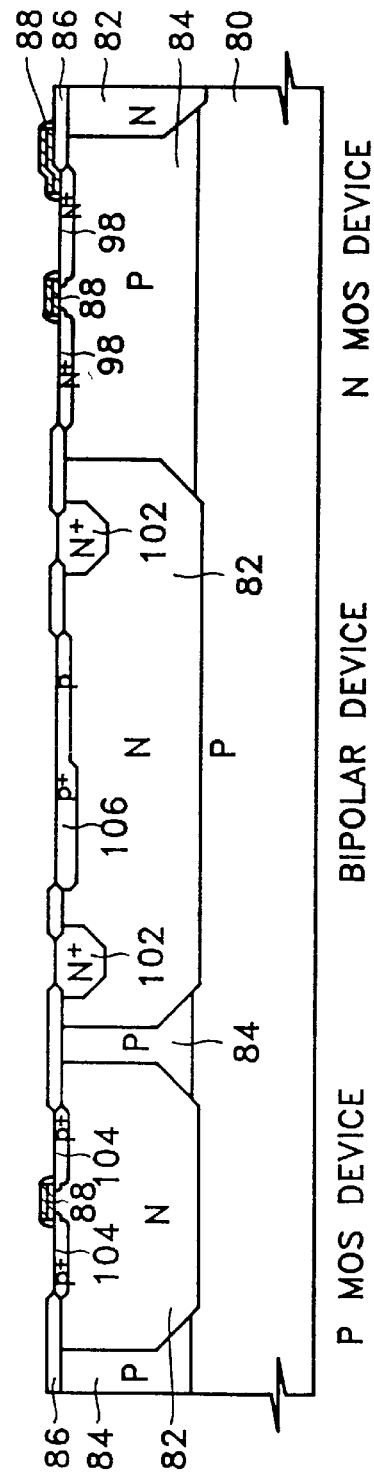

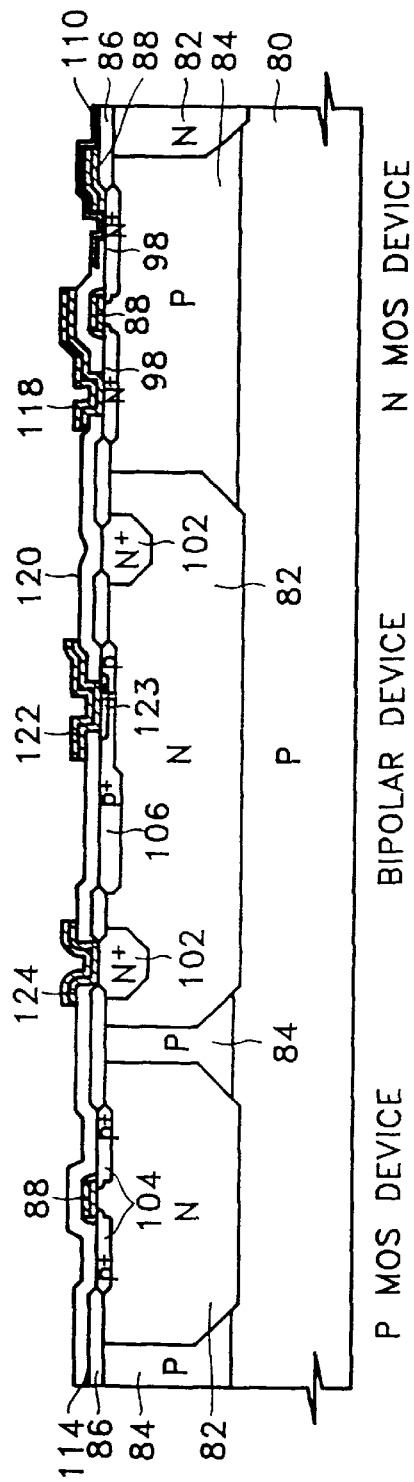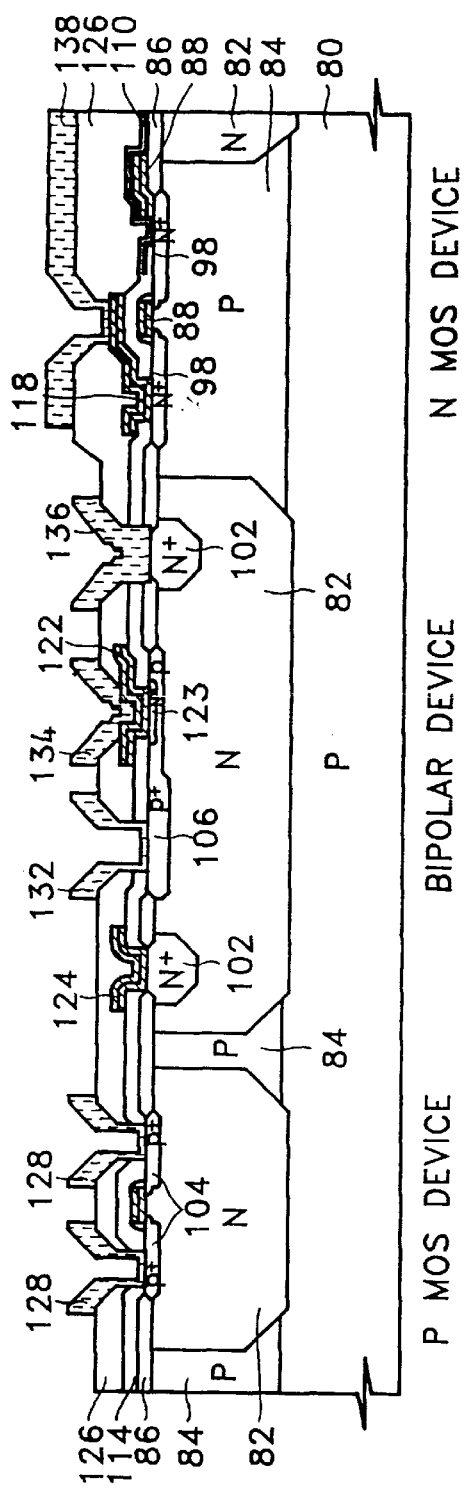

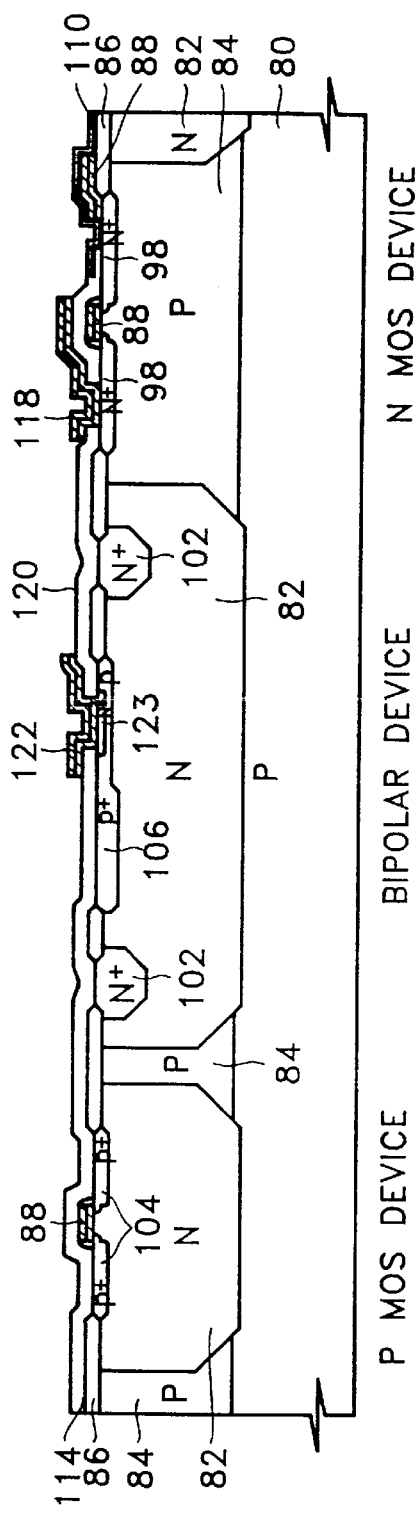
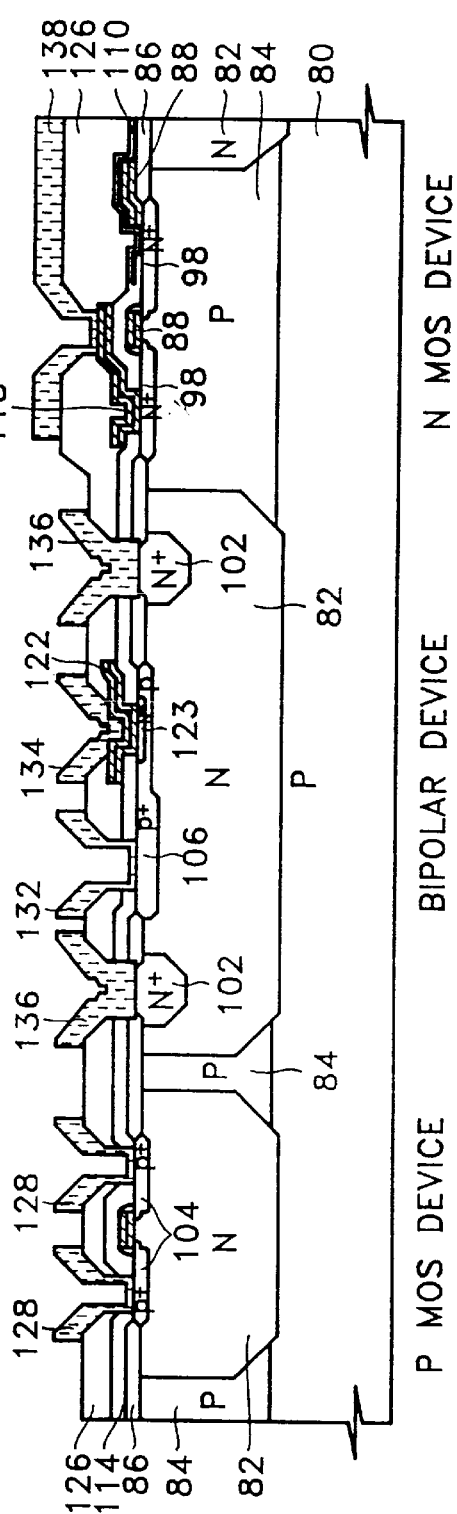

METHOD OF MAKING BIPOLAR TRANSISTOR HAVING REDUCED RESISTANCE

This is a division of application Ser. No. 08/564,970, filed Nov. 30, 1995 now abandoned.

BACKGROUND OF THE INVENTION

The present invention relates to a BiCMOS device and a manufacturing method thereof, and more particularly, to a bipolar transistor by which a problem of lowered reliability is solved, and a manufacturing method thereof.

A BiCMOS technique, which attains high speed operation and low current consumption by incorporating a bipolar transistor and a MOS transistor into one chip in order to take advantage of benefits of each device, has been widely adopted in the semiconductor memory field. Several methods for manufacturing various types of bipolar transistors have been proposed for a BiCMOS manufacturing technique to optimize the function of the bipolar and MOS transistors. Here, typical structures include a selectively ion-implanted collector (SIC) and a base electrode surround emitter transistor (BEST). In particular, a high-concentration buried layer fabrication process and an epitaxial process are essential for manufacturing a high-performance bipolar transistor.

FIG. 1 is a cross-sectional view of a BiCMOS structure manufactured by a first conventional method, in which an epitaxial process is performed to form the bipolar and MOS transistors and a high-concentration buried layer is formed in the lower portions of the respective devices, for reducing the surface resistance of a collector and for efficient inter-device insulation. In FIG. 1, a periphery circuit region includes a bipolar transistor and a PMOS transistor, and an SRAM cell region includes an NMOS and a high-resistance polysilicon layer.

In the above constitution, N-type high-concentration buried layer 3 and P-type buried layer 5 are selectively formed in the vicinity of the surface of a semiconductor substrate 1, and an epitaxial layer (epi) is formed thereon. An N-well 7 is formed within the epitaxial layer over the N-type high-concentration buried layer 3, and a P-well 9 is formed within the epitaxial layer over the P-type buried layer 5. The bipolar transistor and the PMOS transistor are formed within N-well 7 so as to be insulated from each other, and an NMOS transistor is formed within P-well 9. The bipolar transistor comprises a collector impurity layer having N-well 7 and high-concentration collector impurity layer 11, base impurity layer 13, and emitter impurity layer 15. Here, the high-concentration collector impurity layer 11 is formed to be connected with N-type high-concentration buried layer 3. The PMOS transistor is composed of a P-type source/drain region 17 and a gate electrode 25, and the NMOS transistor is composed of an N-type source/drain regions 19 and a gate electrode 26. High-resistance polysilicon layer 29 of the SRAM cell is connected with one portion of source/drain region 19 of the NMOS transistor. Emitter impurity layer 15 and the other portion of the source/drain region 19 are connected with electrodes 35 and 43 via pad layers 23 and 31, respectively. Collector electrode 33 of the bipolar transistor is connected with high-concentration collector impurity layer 11. A base electrode 37 is connected with base impurity layer 13. Source/drain electrodes 39 of the PMOS transistor are respectively connected with source/drain regions 17. Also, reference numeral 21 denotes a field oxide layer, and reference numerals 27 and 45 denote insulation layers.

The BiCMOS manufactured by the first conventional method must undergo successive procedures of selectively forming high-concentration buried layer 3 and buried layer 5 on the surface of a semiconductor substrate, growing an epitaxial layer of 1~2μm on the whole surface thereof, forming an N-well or P-well in the epitaxial layer, and forming a bipolar transistor and MOS transistors within the well.

When comparing the conventional CMOS manufacturing process and the aforementioned BiCMOS manufacturing process, the latter is more difficult (i.e., more complicated) than the conventional one which is performed by merely forming a MOS transistor within an N-well or P-well formed in the substrate, in that it necessitates the further steps of forming a high-concentration buried layer and an epitaxial layer. Particularly, the epitaxial layer forming process requires a high-precision technique, which is time-consuming and costly.

In order to abate the above complexity and, in doing so, save processing time and cost, there is a BiCMOS manufacturing technique which eliminates the heretofore essential processes of forming a high-concentration buried layer and epitaxial layer. Here, a bipolar transistor and a MOS transistor are formed in a well which is formed in a substrate.

FIG. 2 is a cross-sectional view of a bipolar transistor manufactured by a second conventional method for forming a BiCMOS structure, in which a well is formed in a semiconductor substrate and then a bipolar transistor is formed within the well. Unlike the first conventional method by which, after forming an epitaxial layer on a semiconductor substrate, a well is formed in the epitaxial layer and active devices are formed within the well. In FIG. 2, only the bipolar transistor of a BiCMOS is shown because this is where the most severe reduction in performance occurs when the high-concentration buried layer and epitaxial layer are not formed. (Although not shown, it is assumed that MOS transistors are formed around the bipolar transistor.)

Referring to FIG. 2, after forming N-well 52 and P-well 54 by selectively injecting impurity ions into a semiconductor substrate 50, a field oxide layer 62 is formed on the surface of the substrate by selective thermal oxidation. Subsequently, high concentration N-impurities are injected into a predetermined region, to form high-concentration collector impurity layer 56. Thereafter, high concentration P-type impurities are selectively injected to form a high concentration P-impurity layer 64 and base impurity layer 58 for an ohmic contact. Next, the impurities of a pad layer 70, on which an impurity-doped polysilicon and silicide are deposited, diffuse into the semiconductor substrate, thereby forming an emitter impurity layer 60. Then, electrodes 72, 74, 76 and 78 are formed by a conventional method.

According to the second conventional bipolar transistor manufacturing method, as the processes for forming the high-concentration buried layer and epitaxial layer are omitted, the overall manufacturing process is simplified, thereby reducing the processing time and cost. However, the following characteristic deterioration of the bipolar transistor typically becomes noticeable.

First, the influence of parasitic bipolar transistors becomes prominent, which affects the operation of a BiCMOS logic gate. As shown in FIG. 2, a PNP parasitic bipolar transistor is composed of a base impurity layer 58 of the bipolar transistor, N-well 52, and P-impurity layer 64 formed on P-well 54.

Secondly, collector resistance is increased, thereby lowering the operational speed of a device. Since the current passing through emitter impurity layer 60 and base impurity layer 58 flows unidirectionally by the voltage applied to collector electrode 72, i.e., from base impurity layer 58 to high-concentration collector impurity layer 56, the resistance of the path along which the current flows becomes relatively high.

SUMMARY OF THE INVENTION

It is an object of the present invention to provide a bipolar transistor whose manufacturing process is simple, collector resistance is low, the operation of a parasitic bipolar transistor is prevented and the flexibility of the layout in forming a collector electrode is increased.

It is another object of the present invention to provide a suitable method for manufacturing the bipolar transistor.

To accomplish the above and other objects, the bipolar transistor according to the present invention comprises: a well of a first conductivity; an emitter impurity layer formed in the center of the well; a base impurity layer formed in the form of completely surrounding the emitter impurity layer; and a first conductive high-concentration collector impurity layer having an annular pattern along the edge of the well, and maintaining a constant interval from the base impurity layer.

In an embodiment of the present invention, a first conductive layer above the high-concentration collector impurity layer and a first contact hole for connecting the high-concentration collector impurity layer with the first conductive layer is preferably further formed. At this time, the high-concentration collector impurity layer preferably parallels with the high-concentration collector impurity layer to be formed in an annular pattern.

The first conductive layer is preferably formed of polysilicon, a polycide or a metal material.

Also, a second conductive layer above the first conductive layer and a second contact hole for connecting the first conductive layer with the second conductive layer are preferably further formed. At this time, the first conductive layer is preferably formed of polysilicon or a polycide, and the second conductive layer is preferably formed of a metal material.

In another embodiment of the present invention, the first conductive layer is preferably disposed so as to be partially parallel the high-concentration collector impurity layer. At this time, the first conductive layer preferably has a U-shaped pattern, a square pattern or a two-parallel line pattern.

Also, a third conductive layer above the high-concentration collector impurity layer and a third contact hole are preferably further formed. At this time, the first and third conductive layers preferably overlap each other partially. Also, a fourth conductive layer for connecting the first conductive layers with the third conductive layers is further formed on the third conductive layer.

When a third contact hole for connecting the high-concentration collector impurity layer with the third conductive layer is formed on the third conductive layer, contact holes above the first conductive layer for connecting the third conductive layer with the first conductive layer are preferably further formed.

The third conductive layer is preferably formed above the first conductive layer.

The first and third conductive layers are preferably formed of polysilicon, a polycide, or a metal material. At this time, the first conductive layer is preferably formed of polysilicon or a polycide, and the third conductive layer is preferably formed of a metal material.

The bipolar transistor is preferably included in a BiCMOS structure.

To accomplish the other object, the method for manufacturing the bipolar transistor according to the present invention comprises the steps of: forming a well of a first conductivity in a semiconductor substrate; forming a base impurity layer by injecting second conductivity impurities in the center of the well; forming an annular high-concentration collector impurity layer surrounding the base impurity layer by injecting first conductivity impurities along the edge of the well; and forming an emitter impurity layer by selectively doping first conductivity impurities on the base impurity layer.

The well is preferably formed by the steps of partially injecting phosphorus ions on the semiconductor substrate at an energy of about 100 keV and a dose of about 3.01E13 ions/cm$^2$, and heat-processing in a nitrogen atmosphere, at a temperature of about 1,150° C. and for about 12 hours.

The base impurity layer is preferably formed by injecting boron ions at an energy of about 30 keV and a dose of about 3.0E13 ions/cm$^2$.

The high-concentration collector impurity layer is preferably formed by injecting phosphorus ions at an energy of about 100 keV and a dose of about 5.0E15 ions/cm$^2$.

The emitter impurity layer formation step is preferably accomplished through the sub-steps of forming an insulation layer on a semiconductor substrate, forming a first contact hole exposing a portion where an emitter impurity layer is to be formed by selectively etching the insulation layer, depositing polysilicon on the resultant structure where the first contact hole is formed, injecting impurity ions on the polysilicon, depositing silicide on the polysilicon injected by the impurity ions, and patterning the deposited polysilicon and silicide.

At this time, the impurity ion injecting step is preferably performed by injecting arsenic ions are injected at an energy of about 100 keV and a dose of about 7.0E15 ions/cm$^2$.

During the first contact hole formation step, a second contact hole through which the high-concentration collector impurity layer is partially exposed is preferably further formed at the same time. Also, by the step of patterning the polysilicon and silicide, a pad layer connected with the emitter impurity layer and a first conductive layer connected with the high-concentration collector impurity layer are preferably further formed simultaneously.

A preferred embodiment of the present invention preferably further includes, after forming the pad layer and first conductive layer, the steps of forming a second insulation layer on the resultant structure where the pad layer and first conductive layer are formed, forming a contact hole partially exposing the base impurity layer, pad layer and first conductive layer by partially etching the first and second insulation layers, depositing a second conductive material on the resultant structure where the third contact hole is formed, and forming a base electrode connected with the base impurity layer, an emitter electrode connected with the pad layer, and a collector electrode connected with the first conductive layer, by patterning the second conductive material.

The second contact hole selectively exposing the high-concentration collector impurity layer is preferably at least one. The first conductive layer is preferably patterned so as to be parallel with the high-concentration collector impurity layer to then be formed in an annular pattern.

Also, the first conductive material is preferably formed of polysilicon or a polycide, and the second conductive layer is preferably formed of a metal material.

Another preferred embodiment of the present invention preferably further includes, after forming the pad layer and the first conductive layer, the steps of forming a second insulation layer on the resultant structure where the pad layer and the first conductive layer are formed, forming a fourth contact hole selectively exposing the base impurity layer, pad layer and high-concentration collector impurity layer by partially etching the first and second insulation layers, depositing a third conductive material on the resultant structure where the fourth contact hole is formed, and forming a base electrode connected with the base impurity layer, an emitter electrode connected with the pad layer, and a collector electrode connected with the high-concentration collector impurity layer, by patterning the third conductive material.

At this time, the first conductive layer is preferably patterned so as to be partially parallel with the high-concentration collector impurity layer, and the collector electrode is preferably formed so as to be partially overlapped with the high-concentration collector impurity layer.

Also, the first conductive layer and collector electrode are preferably interconnected. At this time, a second conductive layer above the collector electrode for connecting the first conductive layer with collector electrode is further formed.

The first conductive material is preferably formed of polysilicon or a polycide of stacked polysilicon and silicide, and the second conductive layer is preferably formed of a metal material.

Still another preferred embodiment of the present invention preferably further includes, after forming the pad layer and the first conductive layer, the steps of forming a second insulation layer on the resultant structure where the pad layer and the first conductive layer are formed, forming a fifth contact hole selectively exposing the base impurity layer, pad layer, first conductive layer and high-concentration collector impurity layer by partially etching the first and second insulation layers, depositing a third conductive material on the resultant structure where the fifth contact hole is formed, and forming a base electrode connected with the base impurity layer, an emitter electrode connected with the pad layer, and a collector electrode connected with the first conductive layer and high-concentration collector impurity, by patterning the third conductive material.

At this time, the first conductive layer is preferably patterned so as to be partially parallel with the high-concentration collector impurity layer.

BRIEF DESCRIPTION OF THE DRAWINGS

The above objects and advantages of the present invention will become more apparent by describing in detail a preferred embodiment thereof with reference to the attached drawings in which:

FIGS. 3A to 3C are schematic layouts according to the embodiments of the present invention;

FIGS. 5A to 5I are cross-sectional views for explaining the method for manufacturing the bipolar transistor according to a first embodiment of the present invention, taken along the line A—A of FIG. 3A;

FIGS. 6A and 6B are cross-sectional views for explaining the method for manufacturing the bipolar transistor according to a second embodiment of the present invention, taken along the line B—B of FIG. 3B; and FIGS. 7A and 7B are cross-sectional views for explaining the method for manufacturing the bipolar transistor according to a third embodiment of the present invention, taken along the line C—C of FIG. 3C.

DETAILED DESCRIPTION OF THE INVENTION

Figure 3A:
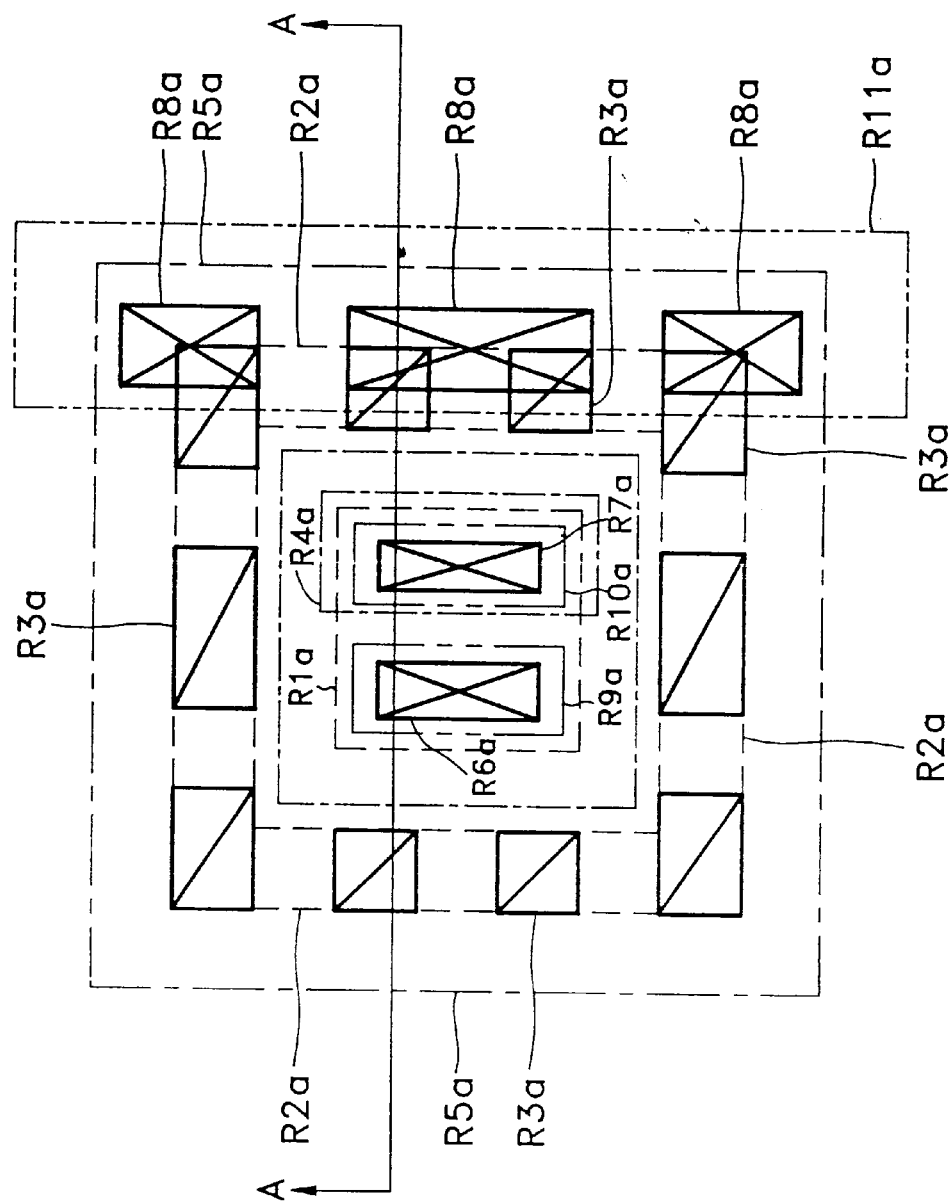

In FIGS. 3A to 3C, each square region defined by a dot line is a base impurity region R1a, R1b or R1c, each annular region defined by a dot line is a high-concentration collector impurity region R2a, R2b or R2c, an internally oblique-lined rectangular region defined by a solid line is a contact hole region R3a, R3b or R3c for connecting a high-concentration collector impurity layer with a first conductive layer, a rectangular region defined by a single-dashed line and overlapped with the region R1a, R1b or R1c is a pad layer region R4a, R4b or R4c connected with an emitter impurity layer, a region defined by a single-dashed line and overlapped with the region R2a, R2b or R2c is a first conductive layer region R5a, R5b or R5c connected with a high-concentration collector impurity layer, a rectangular region defined by a solid line, positioned within the region R1a, R1b or R1c and internally having two intersecting diagonal lines is a contact hole R6a, R6b or R6c for connecting a base electrode with a base impurity layer, a rectangular region positioned in the right of the region R6a, R6b or R6c and internally having two intersecting diagonal lines is a contact hole R7a, R7b or R7c for connecting the pad layer with the emitter electrode, a rectangular region positioned in the far right and internally having two intersecting diagonal lines is a contact hole R8a, R8b or R8c for connecting the first conductive layer with the collector electrode, a rectangular region defined by a double-dashed line and internally containing the region R6a, R6b or R6c is a base electrode region R9a, R9b or R9c, a rectangular region defined by a double-dashed line and internally containing the region R7a, R7b or R7c is an emitter electrode region R10a, R10b or R10c, and a rectangular region defined by a double-dashed line and internally containing the region R8a, R8b or R8c is a collector electrode region R11a, R11b or R11c.

According to the layout shown in FIG. 3A, the high-concentration collector impurity layer R2a and first conductive layer R5a surround base impurity layer R1a like a doughnut, and at least a contact hole R3a for connecting first conductive layer R5a and high-concentration collector impurity layer R2a is formed throughout on the high-concentration collector impurity layer R2a. Also, the collector electrode R11a is connected with the high-concentration collector impurity layer R2a through the first conductive layer R5a. At this time, the collector electrode R11a is connected with the first conductive layer R5a by the contact holes R8a formed on the first conductive layer R5a. Also, the collector electrode R11a may be disposed in a predetermined shape in consideration of the disposition of the base electrode R9a and emitter electrode R10a or the disposition of the other surrounding electrodes.

According to the layout shown in FIG. 3B, the high-concentration collector impurity layer R2b surrounds the base impurity layer R1b in an annular pattern, the first conductive layer R5b partially surrounds the base impurity layer R1b in a U-shape pattern, unlike FIG. 3A. At least a contact hole R3b for connecting first conductive layer R5b with high-concentration collector impurity layer R2b is partially formed on the high-concentration collector impurity layer R2b. Also, the collector electrode R11b is partially overlapped with the first conductive layer R5b. At this time, the collector electrode R11b is connected with the first conductive layer R5b through the contact hole R8b formed on the first conductive layer R5b and is also connected with the high-concentration collector impurity layer R2b by the contact hole R8b formed on the high-concentration collector impurity layer R2b.

According to the layout shown in FIG. 3C, the first conductive layer R5c is formed being parallel with the high-concentration collector impurity layer R2c in a two-parallel line pattern, and the collector electrode R11c is disposed vertically with respect to the progress direction of the first conductive layer R5c at the edge thereof.

Although not shown in the layouts shown in FIGS. 3A to 3C, the region R8 disposed on the region R5 may be removed so that the first conductive layer and collector electrode are not interconnected. At this time, of course, the first conductive layer and collector electrode may be interconnected through another contact holes (not shown).

Figure 2:
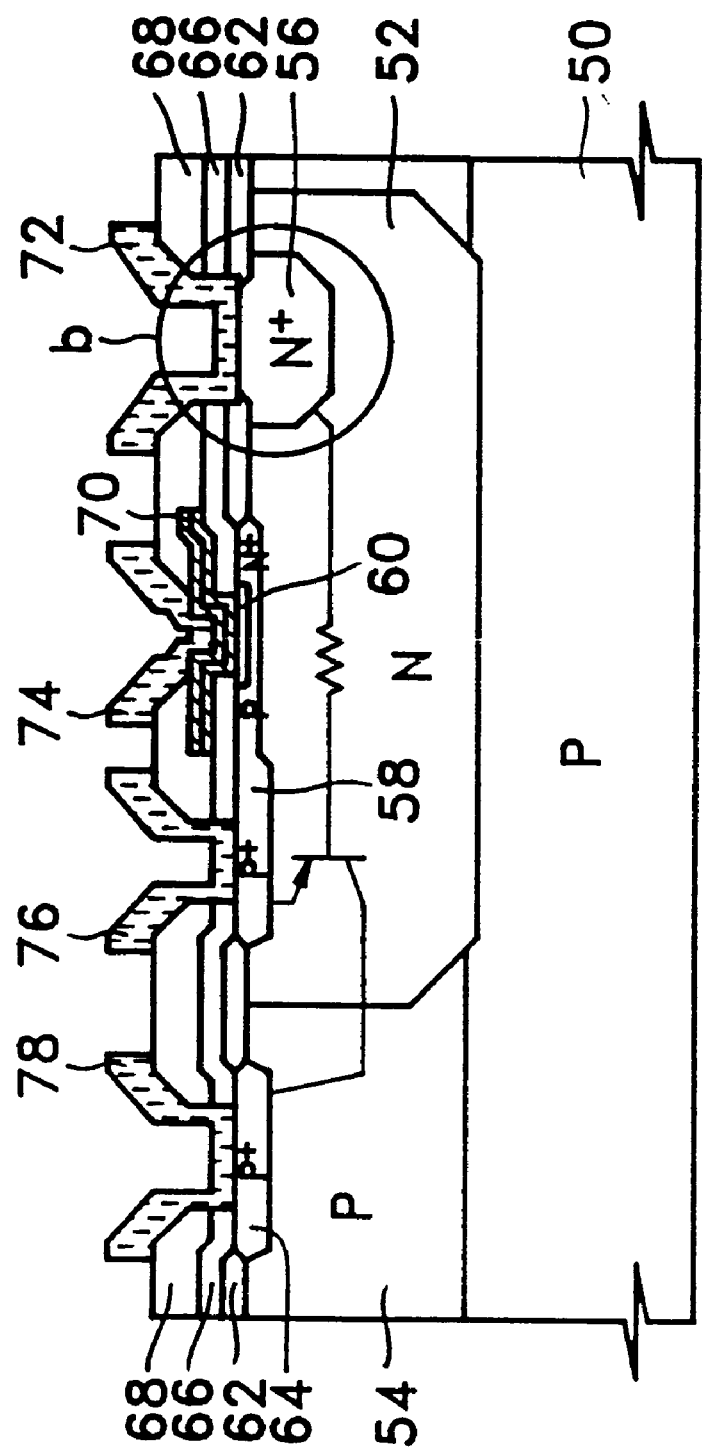
FIG. 2 is a cross-sectional view of a bipolar transistor manufactured by another conventional method.

According to the layouts as shown, the current flowing from the emitter impurity layer to the collector impurity layer through the base impurity layer goes anywhere the high-concentration collector impurity layer is formed, unlike the bipolar transistor shown in FIG. 2. Thus, the collector resistance can be considerably lowered.

Figure 4A:
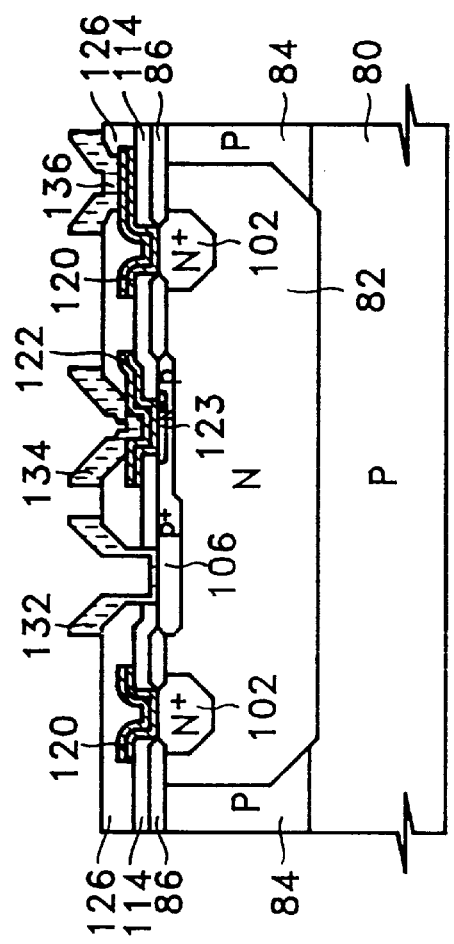
FIGS. 4A to 4C are cross-sectional views taken along the lines A—A, B—B and C—C of FIGS. 3A, 3B and 3C, respectively.
Figure 4B:
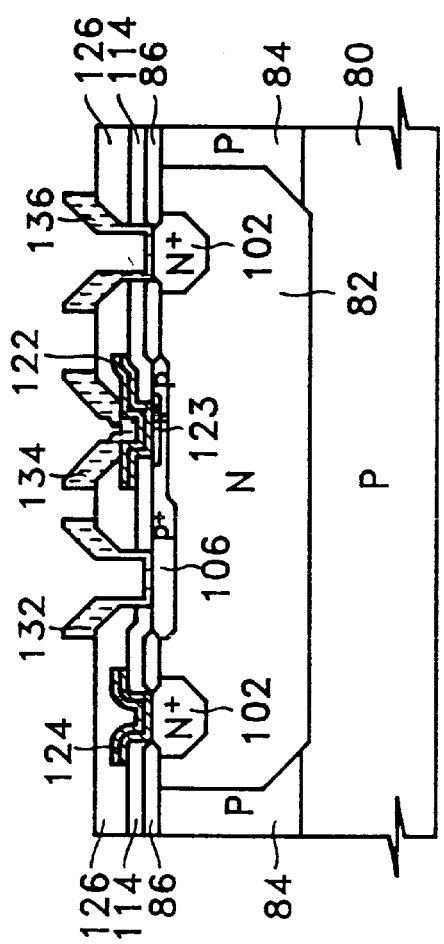
Figure 4C:
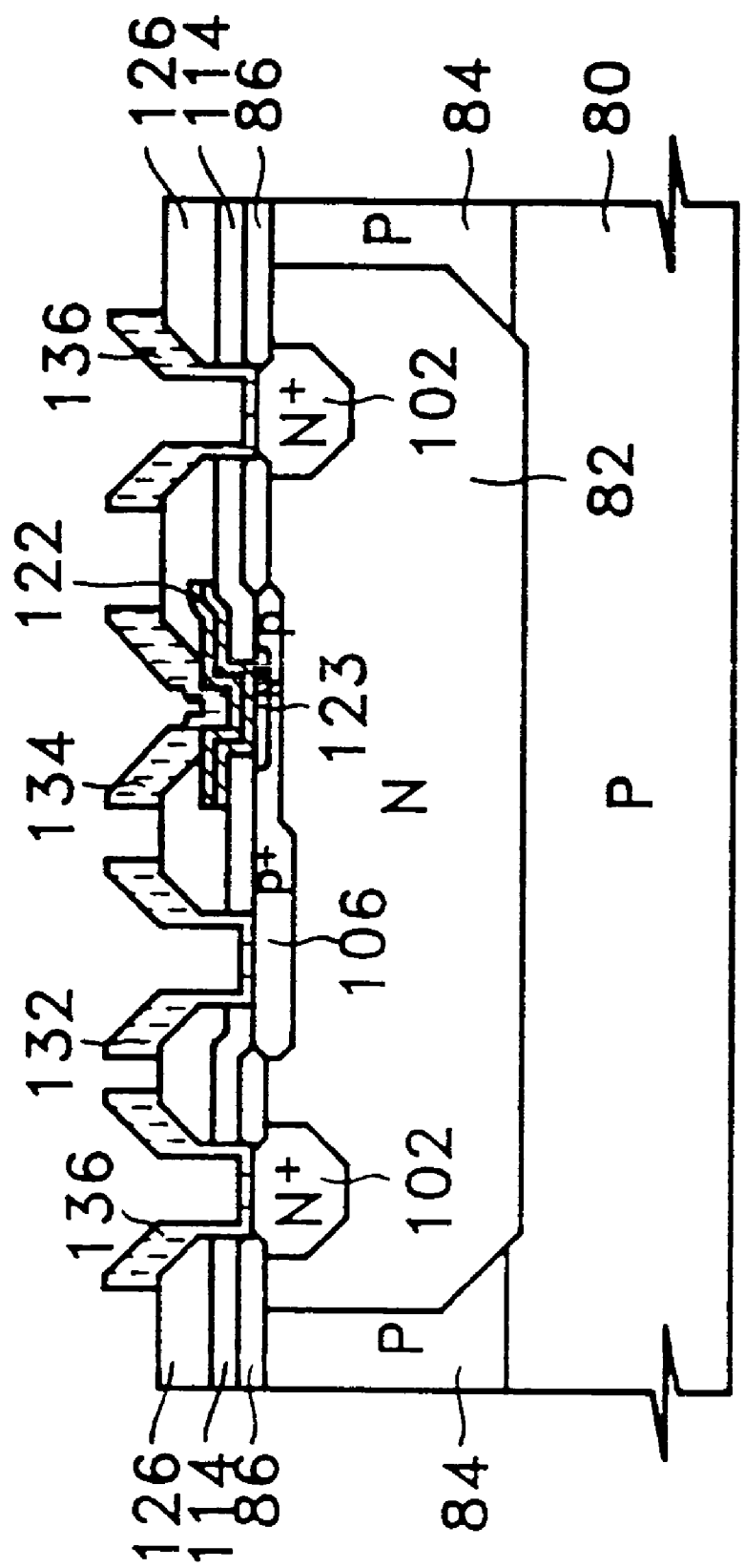

FIGS. 4A to 4C are cross-sectional views taken along the lines A—A, B—B and C—C of FIGS. 3A, 3B and 3C, respectively.

N-well 82 and P-well 84 are formed on a semiconductor substrate 80, and a bipolar transistor is formed within the N-well 82. A high-concentration collector impurity layer 102 is formed in both sides of a base impurity layer 106, and an emitter impurity layer 123 is formed within the base impurity layer 106. At this time, referring to FIGS. 3A to 3C, the high-concentration collector impurity layer 102 surrounds the base impurity layer 106 in an annular pattern, although not shown in FIGS. 4A to 4C.

Referring to FIG. 4A, a first conductive layer 120 is formed on the whole surface of the high-concentration collector impurity layer 102, and is partially connected with a collector electrode 136 through the contact holes formed on the first conductive layer 120.

Referring to FIG. 4B, a first conductive layer 124 is formed on a part of the surface of the high-concentration collector impurity layer 102 in a U-shaped pattern. The collector electrode 136 is connected with the first conductive layer 124 and high-concentration collector impurity layer 102 through the contact holes formed on the first conductive layer 124 and high-concentration collector impurity layer 102 (referable to R5b, R8b and R11b).

Referring to FIG. 4C, a first conductive layer (not shown) is formed on a part of the surface of the high-concentration collector impurity layer 102 in a two-parallel line pattern. The collector electrode 136 is connected with the first conductive layer and high-concentration collector impurity layer 102 through the contact holes formed on the first conductive layer and high-concentration collector impurity layer 102 (referable to R5c, R8c and R11c).

At this time, the first conductive layer and collector electrode 136 may be interconnected through the contact hole formed on the first conductive layer (referable to R8b and R8c), or may be interconnected by another conductive material formed on the first conductive layer and collector electrode 136.

The current of a bipolar transistor flows from the emitter impurity layer 123 to the high-concentration collector impurity layer 102 via the base impurity layer 106. At this time, since the high-concentration collector impurity layer 102 surrounds the base impurity layer 106 in an annular pattern, the current passing through the base impurity layer 106 is dispersed in every direction and then collects into the high-concentration collector impurity layer 102.

Therefore, according to the bipolar transistor of the present invention, since the problem of the prior art in which the current flows unidirectionally is solved, the collector resistance can be reduced.

First Embodiment

Figure 1:
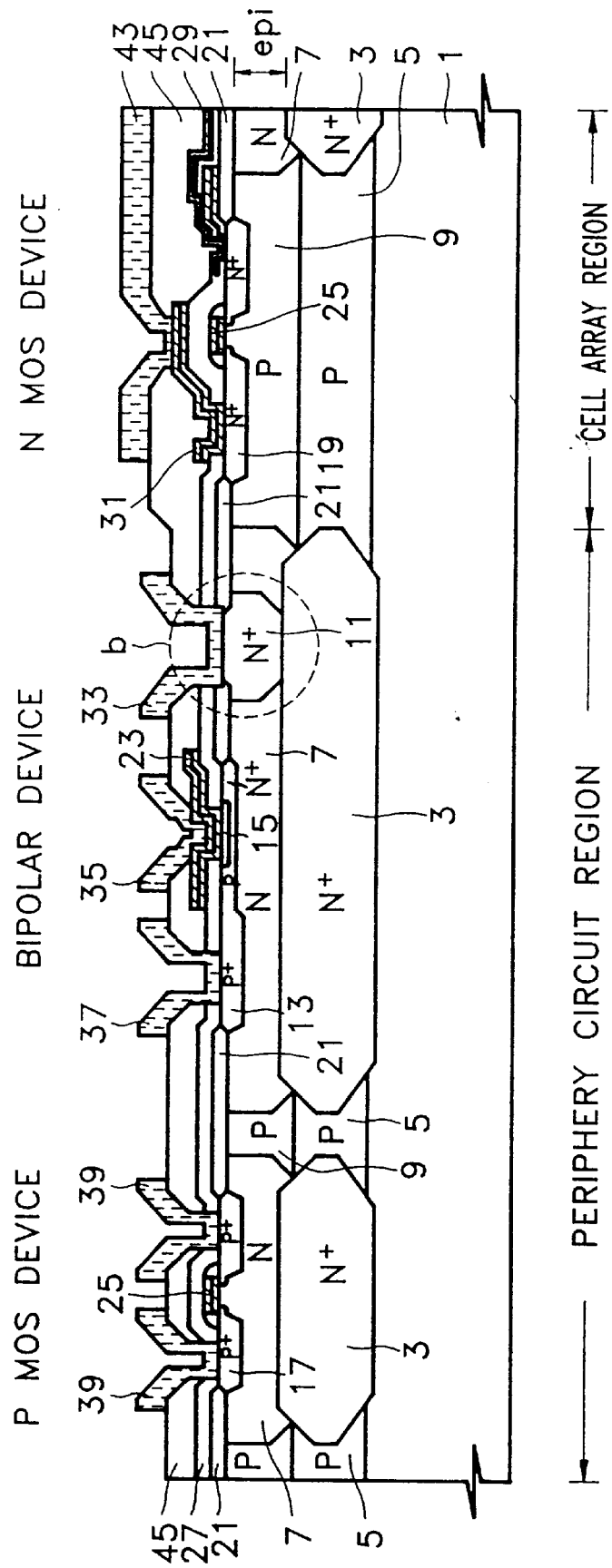
FIG. 1 is a cross-sectional view of a BiCMOS manufactured by a conventional method.

FIGS. 5A to 5I are cross-sectional views for explaining the method for manufacturing the bipolar transistor according to a first embodiment of the present invention, taken along the line A—A of FIG. 3A, which show in detail the bipolar transistor adopted for a SRAM device. The left part of the drawings indicates a peripheral circuit region, and the right part thereof indicates a cell region (FIG. 1).

First, FIG. 5A shows a process of forming wells 82 and 84 in a semiconductor substrate 80, which is processed through a first step of forming a N-well 82 and P-well 84 in the P-type semiconductor substrate 80 using a conventional selective oxidation (local oxidation silicon: LOCOS) process, and a second step of partially forming a field oxide layer for a device separation on the surface of the semiconductor substrate 80 further using a conventional selective oxidation process.

At this time, the N-well 82 and P-well 84 are formed by injecting phosphorus ions at an energy of about 100 keV and a dose of about 3.0E13 ions/cm$^2$, and boron ions at an energy of about 80 keV and a dose of about 2.0E13 ions/cm$^2$, and by heat-processing the same in a nitrogen atmosphere at about 1,150° C. for about 12 hours to then be diffused into the semiconductor substrate 80.

In the drawings, the left N-well is a region where a PMOS transistor is to be formed, the middle N-well is a region where an NPN bipolar transistor is to be formed, and the right P-well is a region where an NMOS transistor is to be formed. At this time, the PMOS and bipolar transistor are devices consisting the peripheral circuit region, and the NMOS transistor is a device consisting the cell region.

FIG. 5B shows a process of forming gate electrodes 88 for NMOS and PMOS transistors, which is processed through a first step of performing an ion injection for adjusting a threshold voltage of the transistor on the whole surface of the resultant structure having a field oxide layer 86 formed thereon, a second step of forming a gate oxide layer on the resultant structure, a third step of forming a gate electrode material by depositing polysilicon and tungsten silicide on the gate oxide layer, and a fourth step of forming a gate electrode 88 by patterning the deposited materials.

At this time, the gate electrode 88 is formed on a region where a bipolar transistor is to be formed as well as the region where the PMOS and NMOS transistors are to be formed. The gate electrode material remaining on the region where a bipolar transistor is to be formed is left over for protecting the surface of the semiconductor substrate during the subsequent steps of forming a side wall spacer of the gate electrode or ion-injection for MOS transistor, for example.

FIG. 5C shows a process of forming low-concentration source/drain 92 and 94 for NMOS and PMOS transistors, which is processed through a first step of forming low-concentration source/drain 94 for NMOS transistor by injecting N-type impurity ions such as a phosphorus (P) at an energy of about 40 keV and a dose of about 3.0E13 ions/cm$^2$ on the whole surface of the resultant structure, and a second step of forming low-concentration source/drain 92 for PMOS transistor by injecting P-type impurity ions such as boron difluoride (BF$_2$) at an energy of about 40 keV and a dose of about 4.4E13 ions/cm$^2$ only on the to-be-PMOS region.

At this time, it is apparent to the one ordinarily skilled in the art that a lightly doped drain (LDD) structured source/drain is formed of a low-concentration impurity layer self-aligned with respect to a gate electrode and a high-concentration impurity layer self-aligned with respect to the spacer formed in the side wall of the gate electrode.

FIG. 5D shows a process of forming a spacer 96 in the side wall of a gate electrode 88, which is processed through a first step of forming an insulation layer such as silicon dioxide on the whole surface of the resultant structure having the low-concentration source/drain formed thereon, and a second step of forming a spacer 96 on the side wall of the gate electrode 88 by anisotropic etching the insulation layer.

FIG. 5E shows a process of forming a low-concentration base impurity layer 90, which is processed through a first step of forming a pattern 100 exposing only the portion where a bipolar transistor is to be formed by depositing a material such as a photoresist on the whole surface of the resultant structure having the spacer 96 formed thereon and patterning the same, a second step of removing a gate electrode material deposited on the portion where a bipolar transistor is to be formed, and a third step of forming a low-concentration base impurity layer 90 in the whole region where a bipolar transistor is to be formed by injecting P-type impurities such as boron difluoride (BF$_2$) at an energy of about 30 keV and a dose of about 3.0E13 ions/cm$^2$.

At this time, it is understood that the low-concentration base impurity layer 90 is formed in the region where a high-concentration collector impurity layer is to be formed as well as in the region where a base is to be formed.

FIG. 5F shows a process of forming a high-concentration collector impurity layer 102, base impurity layer 106, LDD structured source/drain 98 for an NMOS transistor, and LDD structured source/drain 104 for a PMOS transistor, which is processed through a first step of forming the high-concentration collector impurity layer 102 by injecting N-type impurity ions such as a phosphorus (P) at an energy of about 100 keV and a dose of about 5.0E15 ions/cm$^2$ in the region where the high-concentration collector impurity layer 102 is to be formed after removing the pattern 100, a second step of forming the base impurity layer 106 and LDD structured source/drain 104 for a PMOS transistor by injecting P-type impurities such as boron difluoride (BF$_2$) at an energy of about 30 keV and a dose of about 5.0E15 ions/cm$^2$ on the region where the PMOS transistor is to be formed and on the partial region of the base impurity layer 106, a third step of forming the LDD structured source/drain 98 for an NMOS transistor by injecting N-type impurities such as arsenic ions at an energy of about 40 keV and a dose of about 5.0E15 ions/cm$^2$.

At this time, the high-concentration collector impurity layer 102 is formed so as to surround the low-concentration base impurity layer 90 in an annular pattern, as the layouts R2a, R2b and R2c.

The region where the high-concentration collector impurity layer 102 is to be formed has P-type impurity ions injected in a predetermined concentration by the process described in FIG. 5E. However, the predetermined concentration is lower than that of impurity ions used during ion injection for forming a high-concentration collector impurity layer so that it does not influence on forming the same.

Figure 5G:
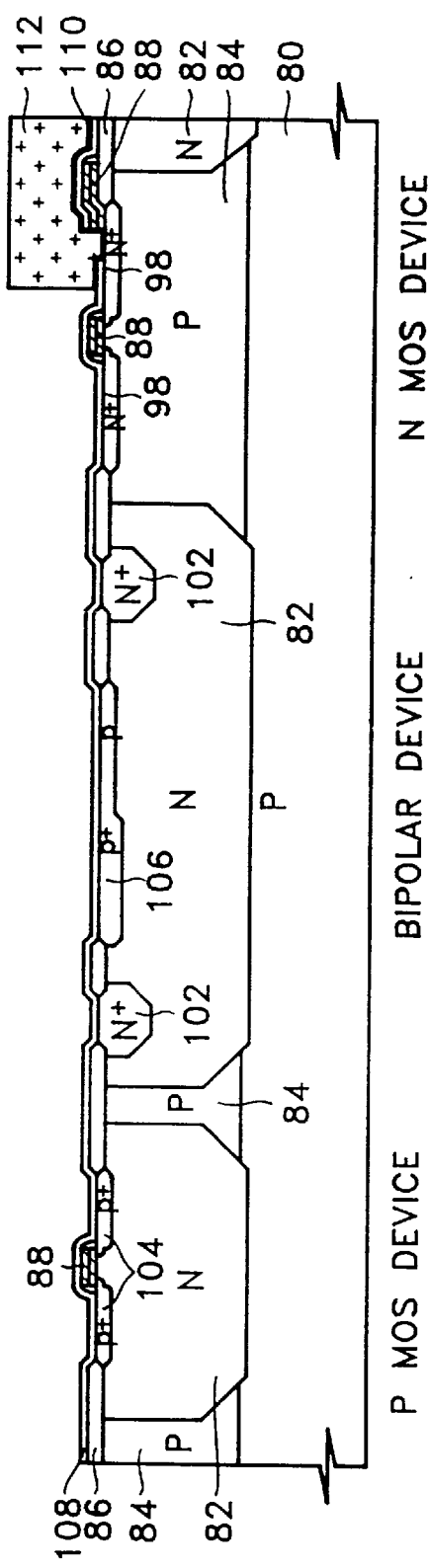

FIG. 5G shows a process of forming a high-resistance polysilicon layer 110, which is processed through a first step of forming an insulation layer 108 by depositing insulation material such as silicon dioxide on the whole surface of the resultant structure, a second step of depositing a material such as polysilicon or amorphous silicon to a thickness of about 500 Å on the whole surface of the resultant structure, and a third step of forming a high-resistance polysilicon by performing a photolithographic process using a first photoresist pattern 112 for forming the high-resistance polysilicon 110 to pattern the same.

At this time, the high-resistance polysilicon 110 included in the SRAM cell has been displayed in the drawing for showing the process of forming the peripheral circuit region and cell region simultaneously.

Figure 5H:
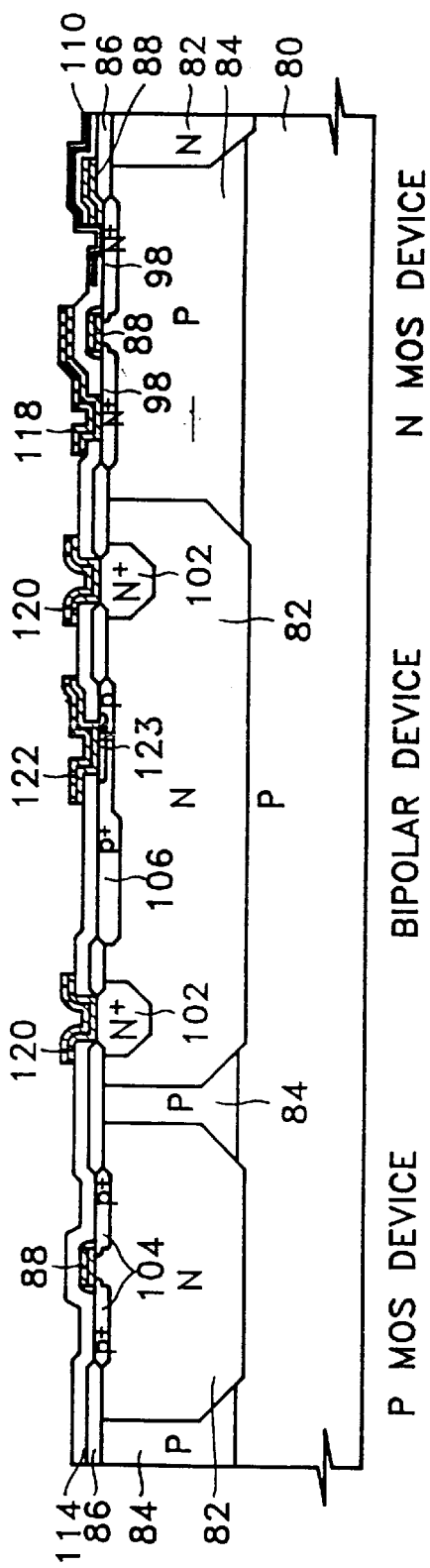

FIG. 5H shows a process of forming an emitter impurity layer 123, first conductive layer 120, first pad layer 122 and second pad layer 118, which is processed through a first step of removing the first photoresist pattern 112, a second step of forming a first insulation layer 114 (shown being combined with the insulation layer 108 of FIG. 5G) on the whole surface of the resultant structure of the first step, a third step of forming contact holes by partially removing the first insulation layer 114 on the high-concentration collector impurity layer 102, base impurity layer 106 and the source/drain 98 for NMOS transistor, a fourth step of depositing a material such as polysilicon to a thickness of about 1,000 Å and injecting N-type impurities such as arsenic ions at an energy of about 100 keV and a dose of about 7.0E15ions/cm$^2$, a fifth step of depositing a silicide material such as tungsten silicide on the impurity-injected polysilicon, and a sixth step of forming a first conductive layer 120 connected with the high-concentration collector impurity layer 102 and a second pad layer 118 connected with source/drain for NMOS transistor by patterning deposited polysilicon and tungsten silicide.

At this time, the first conductive layer 120 is disposed so as to be parallel with the high-concentration collector impurity layer 102 surrounding the base impurity layer 106 (referable to R5a), and at least one contact hole for connecting the first conductive layer 120 and high-concentration collector impurity layer 102 is formed on throughout the high-concentration collector impurity layer 102.

Also, the emitter impurity layer 123 is formed by the diffusion of the impurity ions injected onto the polysilicon layer into a semiconductor substrate, and the first pad layer 122 is disposed so as to be included in the first conductive layer 120 (referable to R4a).

The first conductive layer 120 may be formed of a polycide generated by depositing polysilicon and silicide (the present invention) or a polysilicon when it is formed simultaneously with the first pad layer 122, as described above. However, when the first conductive layer 120 is formed separately from the first pad layer 122, it may be formed of a metal such as aluminum.

If an impurity-doped polysilicon is used as a material composing the first conductive layer 120, the concentration of the high-concentration collector impurity layer 102 becomes higher as the impurities doped onto the polysilicon are diffused.

Figure 5I:
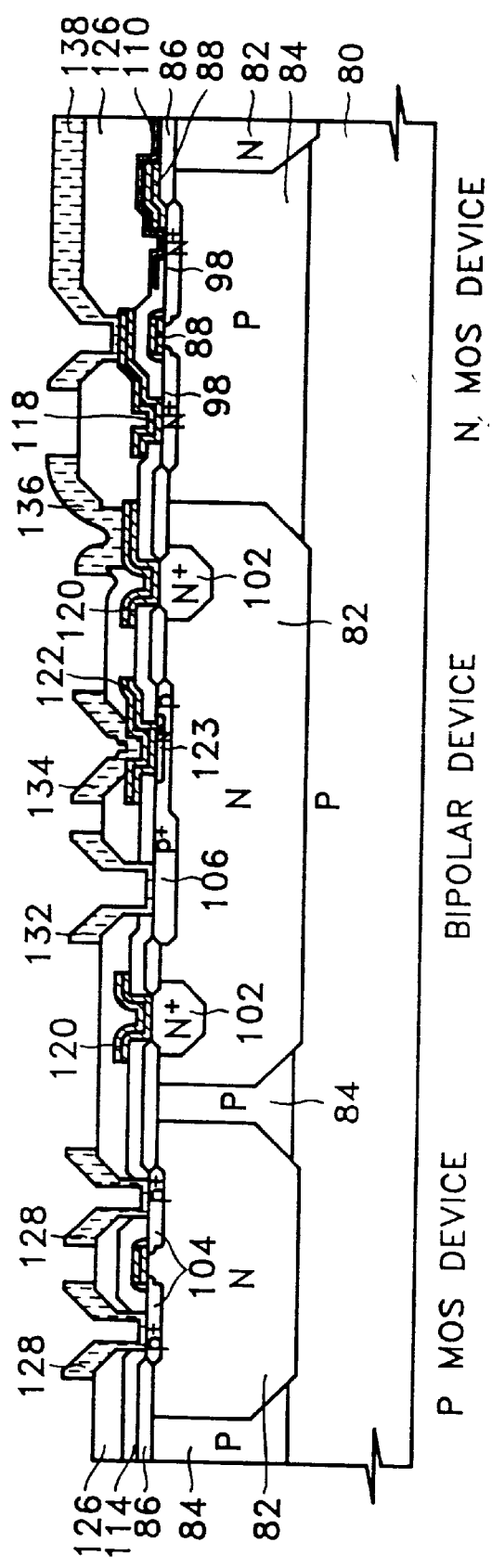

FIG. 5I shows a process of forming electrodes, which is processed through a first step of forming a second insulation layer 126 by depositing an insulation material such as silicon dioxide on the whole surface of the resultant structure where first conductive layer 120 and second pad layer 118 are formed, a second step of forming contact holes by partially removing the first and second insulation layers on the region where the electrodes are to be formed, and a third step of forming source/drain electrode 128 for PMOS, source or drain electrode 138 for NMOS, base electrode 132, emitter electrode 134 and collector electrode 136 by depositing a metal such as aluminum on the whole surface of the resultant structure of the second step and patterning the same.

At this time, the base electrode 132, emitter electrode 134 and collector electrode 136 are disposed so as to correspond to the regions R9a, R10a and R11a, respectively.

The collector electrode 136 is connected with the high-concentration collector impurity layer 102 through the contact hole formed on the first conductive layer 120. At this time, the first conductive layer 120 may be disposed in a discretionary shape according to the disposition of the base electrode 132 and emitter electrode 134. In FIG. 3A, the first conductive layer is disposed in a long rod shape being parallel with the emitter electrode and base electrode.

Second Embodiment

FIGS. 6A and 6B are cross-sectional views for explaining the method for manufacturing the bipolar transistor according to a second embodiment of the present invention, taken along the line B—B of FIG. 3B.

FIG. 6A shows a process of forming a first conductive layer 124, which is processed through a first step of forming a contact hole by partially removing the first insulation layer on the high-concentration collector impurity layer 102, region where the emitter impurity layer is to be formed and source or drain for NMOS transistor, and a second step of forming a first conductive layer 124 connected with the high-concentration collector impurity layer 102 at one end thereof, first pad layer 122 connected with the emitter impurity layer 123, and second pad layer 118 connected with the source or drain for NMOS transistor on the whole surface of the resultant structure by patterning the deposited polycide after the fourth and fifth steps shown in FIG. 5H.

At this time, the first conductive layer 124 is placed partially parallel with the high-concentration collector impurity layer 102, i.e., in a U-shaped pattern (referable to R5b), unlike the first conductive layer 120 shown in FIG. 5H. Thus, the contact hole for connecting the high-concentration collector impurity layer 102 with first conductive layer 124 is formed only on the partial surface of the high-concentration collector impurity layer 102 (referable to R3b).

The first conductive layer 124 is preferably formed of one of polycide and polysilicon. When the first conductive layer forming process does not occur at the same time with the first pad layer 122, the first conductive layer 124 may be formed of a metal.

FIG. 6B shows a process of forming electrodes, which is processed through a first step of forming contact holes on the source/drain 104 for PMOS, first conductive layer 124, first pad layer 122, high-concentration collector impurity layer 102 and source or drain 98 for NMOS by partially etching the first and second insulation layers after completing the process to reach the first step of FIG. 5I, and a second step of forming source/drain electrode 128 for PMOS, base electrode 132, emitter electrode 134, collector electrode 136 and source or drain electrode 138 for NMOS by depositing a metal such as aluminum on the whole surface of the resultant structure and patterning the same.

At this time, the collector electrode 136 is connected with the first conductive layer 134 through the contact hole (not shown) (referable to R8b) formed on the first conductive layer, and is connected with the high-concentration collector impurity layer 102 through the contact hole (region R8 shown in FIG. 3B) formed on the high-concentration collector impurity layer 102.

The collector electrode 136 may be formed so as not to be connected with the first conductive layer 124. In this case, a contact hole for connecting the collector electrode 136 with first conductive layer 124 must be formed. Also, the collector electrode 136 and first conductive layer 124 may be connected through other contact holes respectively formed on each.

It will be apparent to those having the ordinary skill in the art that various modifications can be made in methods for connecting the collector electrode and first conductive layer.

Third Embodiment

FIGS. 7A and 7B are cross-sectional views for explaining the method for manufacturing the bipolar transistor according to a third embodiment of the present invention, taken along the line C—C of FIG. 3C.

In the third embodiment where the first conductive layer (not shown) is formed in a two-parallel line pattern, all processes are the same as those in the second embodiment except the process of patterning the first conductive layer.

Therefore, according to the method for manufacturing a bipolar transistor of the present invention, since a well is formed directly on a semiconductor substrate, the high-concentration buried layer forming process and epitaxial process are avoided, thereby simplifying the manufacturing process (similar to that of CMOS), which saves the processing time and cost. Next, since a high-concentration collector impurity layer is formed so as to surround a base impurity layer in an annular pattern, parasitic bipolar transistors are not generated nor is increased a collector resistance.

In the present invention, a bipolar adopted in manufacturing a BiCMOS transistor and a method of manufacturing the same have been specifically described. However, the present invention can be widely adopted for the case of forming solely a bipolar transistor and other cases.

The present invention is not limited to the above-described embodiments and various changes and modifications may be effected by one skilled in the art within the scope of the invention.

What is claimed is:

1. A method for manufacturing a bipolar transistor comprising the steps of:

forming a well of a first conductivity in a semiconductor substrate;

forming a base impurity layer by injecting second conductivity impurities into a center of the well;

forming an annular high-concentration collector impurity layer surrounding the base impurity layer by injecting first conductivity impurities along an edge of the well;

forming a first insulating layer on the semiconductor substrate;

forming a first contact hole in the first insulating layer by selective etching thereof to expose a portion of the base impurity layer;

forming a second contact hole in the first insulating layer by selective etching thereof to expose a portion of the collector impurity layer;

forming an impurity-doped conductive layer on the first insulating layer to contact the exposed portions of the base impurity layer and the collector impurity layer via the first and second contact holes;

forming an emitter impurity layer by diffusion of the impurity of the impurity-doped conductive layer into the exposed portion of the base impurity layer; and patterning the impurity-doped conductive layer by a photolithography process so as to form a first conductive pad layer connected to the emitter impurity layer and a second conductive pad layer connected to the collector impurity layer.

2. A method for manufacturing a bipolar transistor as claimed in claim 1, wherein the well is formed by the steps of selectively injecting phosphorus ions into the semiconductor substrate at an energy of about 100 keV and a dose of about 3.01E13 ions/cm$^2$, and heat-processing in a nitrogen atmosphere at a temperature of about 1,150° C. for about twelve hours.

3. A method for manufacturing a bipolar transistor as claimed in claim 1, wherein the base impurity layer is formed by injecting boron ions at an energy of about 30 keV and a dose of about 3.0E13 ions/cm$^2$.

4. A method for manufacturing a bipolar transistor as claimed in claim 1, wherein the high-concentration collector impurity layer is formed by injecting phosphorus ions at an energy of about 100 keV and a dose of about 5.0E15 ions/cm$^2$.

5. A method for manufacturing a bipolar transistor as claimed in claim 1, wherein the impurity-doped conductive layer is formed by injecting arsenic ions into polysilicon at an energy of about 100 keV and at a dose of about 7.0E15 ions/cm$^2$.

6. A method for manufacturing a bipolar transistor as claimed in claim 1, wherein the impurity-doped conductive layer is patterned with the high-concentration collector impurity layer.

7. A method for manufacturing a bipolar transistor comprising the steps of:

forming a well of a first conductivity in a semiconductor substrate;

forming a base impurity layer by injecting second conductivity impurities into a center of the well;

forming an annular high-concentration collector impurity layer by injecting first conductivity impurities along an edge of the well;

forming a first insulating layer on the well and on the base and collector impurity layers formed in the well;

forming a first contact hole in the first insulating layer by selective etching thereof to expose a portion of the base impurity layer;

forming an impurity-doped conductive layer on the first insulating layer to contact the exposed portions of the base impurity layer via the first contact hole;

forming an emitter impurity layer by diffusion of the impurity of the impurity-doped conductive layer into the exposed portion of the base impurity layer;

patterning the impurity-doped conductive layer so as to form a first conductive pad layer connected to the emitter impurity layer;

forming a second insulating layer over the first insulating layer and the first conductive pad layer;

selectively etching the second and first insulating layers to expose a further portion of the base impurity layer, a portion of the collector impurity layer and a portion of the first conductive pad layer;

depositing a conductive material on the second insulating layer to contact an exposed further portion of the base impurity layer, an exposed portion of the collector impurity layer and an exposed portion of the first conductive pad layer; and patterning the conductive material to form a base electrode connected with the base impurity layer, an emitter electrode connected with the first conductive pad layer and a collector electrode connected with the collector impurity layer.

8. A method of manufacturing a bipolar transistor as claimed in claim 1, wherein the impurity-doped conductive layer is formed of an impurity-doped polysilicon layer.

9. A method of manufacturing a bipolar transistor as claimed in claim 1, wherein the impurity-doped conductive layer is formed of an impurity-doped polysilicon layer and silicide layer thereon.

10. A method of manufacturing a bipolar transistor as claimed in claim 9, wherein the impurity doped conductive layer is formed by the steps of depositing a polysilicon layer on the first insulating layer, injecting impurity ions into the polysilicon layer and depositing a silicide layer on the polysilicon layer.

11. A method of manufacturing a bipolar transistor as claimed in claim 1, further comprising the steps of:

forming a second insulating layer over the first insulating layer and the first and second conductive pad layers;

selectively etching the second and first insulating layers to form a third contact hole exposing a further portion of the base impurity layer, a portion of the collector impurity layer and the first conductive pad layer;

depositing a conductive material on the second insulating layer to contact an exposed further portion of the base impurity layer, a portion of the collector impurity layer and an exposed first conductive pad layer, via the third contact hole; and patterning the conductive material to form a base electrode connected with the base impurity layer, a collector electrode connected with the collector impurity layer and an emitter electrode layer connected with the first conductive pad layer.

12. A method of manufacturing a bipolar transistor as claimed in claim 1, further comprising the steps of:

forming a second insulating layer over the first insulating layer and the first and second conductive pad layers;

selectively etching the second and first insulating layers to form a fourth contact hole exposing a further portion of the base impurity layer and exposing the first and second conductive pad layers;

depositing a conductive material on the second insulating layer to contact the exposed further portion of the base impurity layer, the exposed first and second conductive pad layers via the fourth contact hole; and patterning the conductive material to form a base electrode connected with the base impurity layer, an emitter electrode connected with the first conductive pad layer and a collector electrode connected with the second conductive pad layer.

13. A method of manufacturing a bipolar transistor as claimed in claim 7, wherein the impurity-doped conductive layer is formed of an impurity-doped polysilicon layer.

14. A method of manufacturing a bipolar transistor as claimed in claim 7, wherein the impurity-doped conductive layer is formed of an impurity-doped polysilicon layer and silicide layer thereon.

15. A method for manufacturing a bipolar transistor as claimed in claim 12, wherein the first conductive layer is patterned so as to be partially parallel with the high-concentration collector impurity layer, and the collector electrode is formed so as to partially overlap the high-concentration collector impurity layer.

* * * * *